(12) United States Patent
Casper et al.

(10) Patent No.: US 7,710,210 B2
(45) Date of Patent: May 4, 2010

(54) APPARATUS FOR DISTRIBUTING A SIGNAL

(75) Inventors: Bryan K. Casper, Hillsboro, OR (US);
Mozhgan Mansuri, Hillsboro, OR (US);
Frank O'Mahony, Portland, OR (US);
James E. Jaussi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 98 days.

(21) Appl. No.: 11/905,080

(22) Filed: Sep. 27, 2007

(65) Prior Publication Data

US 2009/0086871 A1    Apr. 2, 2009

(51) Int. Cl.
*H03K 3/282* (2006.01)

(52) U.S. Cl. .............................. 331/117 R; 331/113 R; 327/311; 327/557

(58) Field of Classification Search ............. 331/117 R, 331/113 R; 327/311, 357
See application file for complete search history.

(56) References Cited

U.S. PATENT DOCUMENTS

| | | | |
|---|---|---|---|
| 4,918,406 A * | 4/1990 | Baumbach et al. | 331/117 R |
| 6,317,008 B1 * | 11/2001 | Gabara | 331/117 R |
| 6,535,037 B2 * | 3/2003 | Maligeorgos | 327/116 |
| 6,538,499 B1 * | 3/2003 | Lu | 327/557 |
| 2005/0220003 A1 * | 10/2005 | Palaskas et al. | 370/210 |

OTHER PUBLICATIONS

Patrick Chiang, et al. "A 20-Gb/s 0.13-μm CMOS Serial Link Transmitter Using an LGPLL to Directly Drive the Output Multiplexer;" IEEE Journal of Solid-State Circuits, vol. 40, No. 4, Apr. 2005; pp. 1004-1011.

* cited by examiner

*Primary Examiner*—Joseph Chang
*Assistant Examiner*—Jeffrey Shin
(74) *Attorney, Agent, or Firm*—KED & Associates, LLP

(57) ABSTRACT

An apparatus is provided that includes an injection locked oscillator and a transmitting device. The injection locked oscillator to receive a first clock signal and to provide a second clock signal by skewing the first clock signal. The transmitting device to receive an input signal and to receive the second clock signal as a clocking signal, the transmitting device to transmit an output signal based on the received clocking signal.

8 Claims, 3 Drawing Sheets

APPARATUS FOR DISTRIBUTING A SIGNAL

BACKGROUND

1. Field

Embodiments of the present invention may relate to distributing a signal, such as a clock signal.

2. Background

Integrated Circuits (ICs) may include a plurality of elements that perform a plurality of operations. A clock signal may be used as a timing reference to synchronize the plurality of operations among the plurality of elements. The clock signal also may be used to synchronize data transfer between the plurality of elements.

BRIEF DESCRIPTION OF THE DRAWINGS

Embodiments may be described in detail with reference to the following drawings in which like reference numerals refer to like elements and wherein.

DETAILED DESCRIPTION

Figure 1:
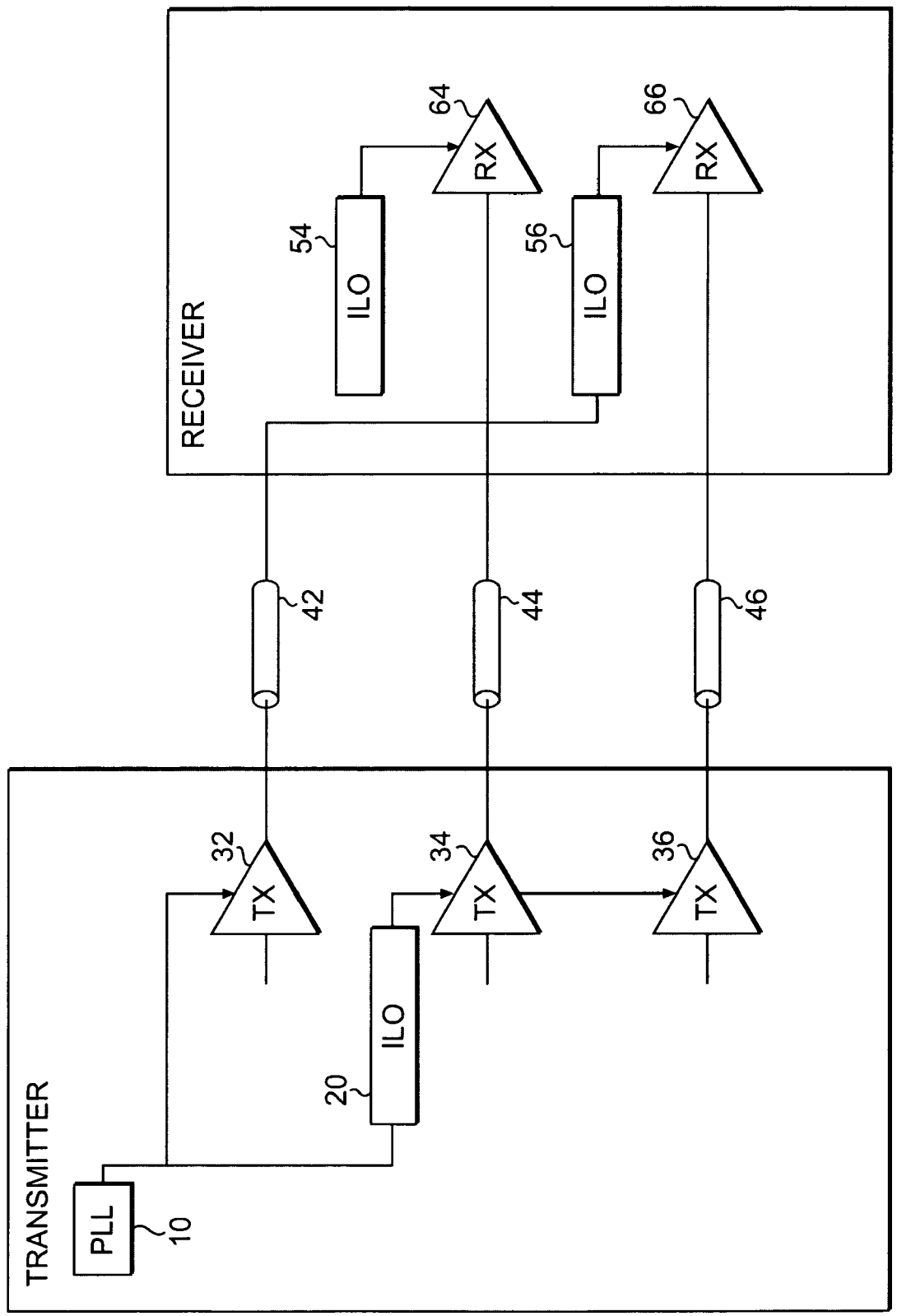
FIG. 1 is a diagram of a transmitter and a receiver according to an example embodiment of the present invention.

In the following description, like reference numerals may be used to designate identical, corresponding or similar components in different drawings. Where specific details are set forth in order to describe example embodiments, it should be apparent to one skilled in the art that embodiments may be practiced without these details.

Embodiments of the present invention may utilize an injection locked oscillator (ILO). An ILO may include an injection locked voltage controlled oscillator (VCO) or a digitally controlled oscillator (DCO), for example.

FIG. 1 is a diagram of a transmitter and a receiver according to an example embodiment of the present invention. Other embodiments and configurations are also within the scope of the present invention. More specifically, FIG. 1 shows a transmitter and a receiver that are coupled together by transmission lines. As shown in FIG. 1, the transmitter may include a phase lock loop (PLL) circuit 10 to provide a reference clock signal (or first clock signal) and a plurality of transmitting (TX) devices 32, 34 and 36. Each of the transmitting devices 32, 34 and 36 separately transmits output signals (i.e., clock signals or data signals) along respective transmission lines 42, 44 and 46 to the receiver. The receiver may include a plurality of receiving (RX) devices 64 and 66 to receive the data from the transmission lines 44, 46 and to receive a clocking signal from the transmission line 42.

The transmitter further includes an injection locked oscillator (ILO) 20 to receive the reference clock from the PLL circuit 10 and to provide a clocking signal by skewing (or phase shifting) the received reference clock signal. The skewed reference clock signal may be used as the clocking signal for each of the transmitting devices 34, 36 (as well as any additional transmitting devices). The received reference clock signal may also be multiplied to provide the clocking signal. Accordingly, the ILO 20 may skew or multiply the reference clock signal to provide the clocking signal. FIG. 1 only shows a single ILO 20 to provide the clocking signals to each of the transmitting devices 34, 36. However, other numbers of ILOs may also be used, such as an individual ILO for each of the transmitting devices 34, 36.

The transmitting device 34 may receive data as an input data signal at an input of the transmitting device 34. The transmitting device 34 may transmit the received data as output data across the transmission line 44 based on the clocking signal applied to the transmitting device 34 (from the ILO 20). Likewise, the transmitting device 36 may receive data as an input data signal at an input of the transmitting device 36. The transmitting device 36 may transmit the received data as output data across the transmission line 46 based on the clocking signal applied to the transmitting device 36 (from the ILO 20).

The reference clock signal output from the PLL circuit 10 may also be used as a clocking signal for the transmitting device 32. The transmitting device 32 may receive a clock as an input data signal at an input of the transmitting device 32. The transmitting device 32 may transmit the received clock as output based on the clocking signal applied to the transmitting device 32.

The receiver may include an ILO 54 and an ILO 56. Other numbers of ILOs may also be used. The ILO 54 may receive the clock output from the transmitting device 32 and provide a clocking signal to each of the receiver circuits 64, 66 by skewing (or shifting) the received output (i.e., the received signal output from the transmitting device 32). The skewed clock signal of the ILO 54 may be used as the clocking signal for the receiving device 64. The ILO 56 may receive the output from the transmitting device 32 and provide a clocking signal by skewing (or shifting) the received output (i.e., the received signal output from the transmitting device 32). The skewed clock signal of the ILO 56 may be used as the clocking signal for the receiving device 66. The ILO 54 and/or the ILO 56 may also multiply the clock output from the transmitting device 32 and provide the respective clocking signals.

The transmission line 42 (or lines) may couple the output of the transmitting device 32 to the input of the ILO 54. The transmission line 44 (or lines) may couple the output of the transmitting device 34 to the input of the receiving device 64. The transmission line 46 (or lines) may couple the output of the transmitting device 36 to the input of the receiving device 66. The receiving device 64 may provide output data based on the clocking signal applied to the receiving device 64. The receiving device 66 may provide output data based on the clocking signal applied to the receiving device 66.

The transmitter shown in FIG. 1 includes the ILO 20 that skews or shifts a clocking signal. This allows skewing of phases between input and output. Stated differently, the ILO 20 may skew (or adjusts) a clock signal for time margining testing of the clock signal relative to a data signal (i.e., for testing purposes). The ILO 20 also allows shifting or skewing of phases of input data with respect to the clocking signal. Additionally, the ILO 20 may also multiply the input versus output clock. On the receiving side (i.e., the receiver), the ILOs 54, 56 perform a deskewing of the received data. The ILOs 54, 56 may also perform a multiplying of the received data.

FIG. 1 shows a system for distributing signals, such as data signals and a clock signal. Embodiments of the present invention are also applicable to distributing a clock signal using an ILO.

Figure 2:
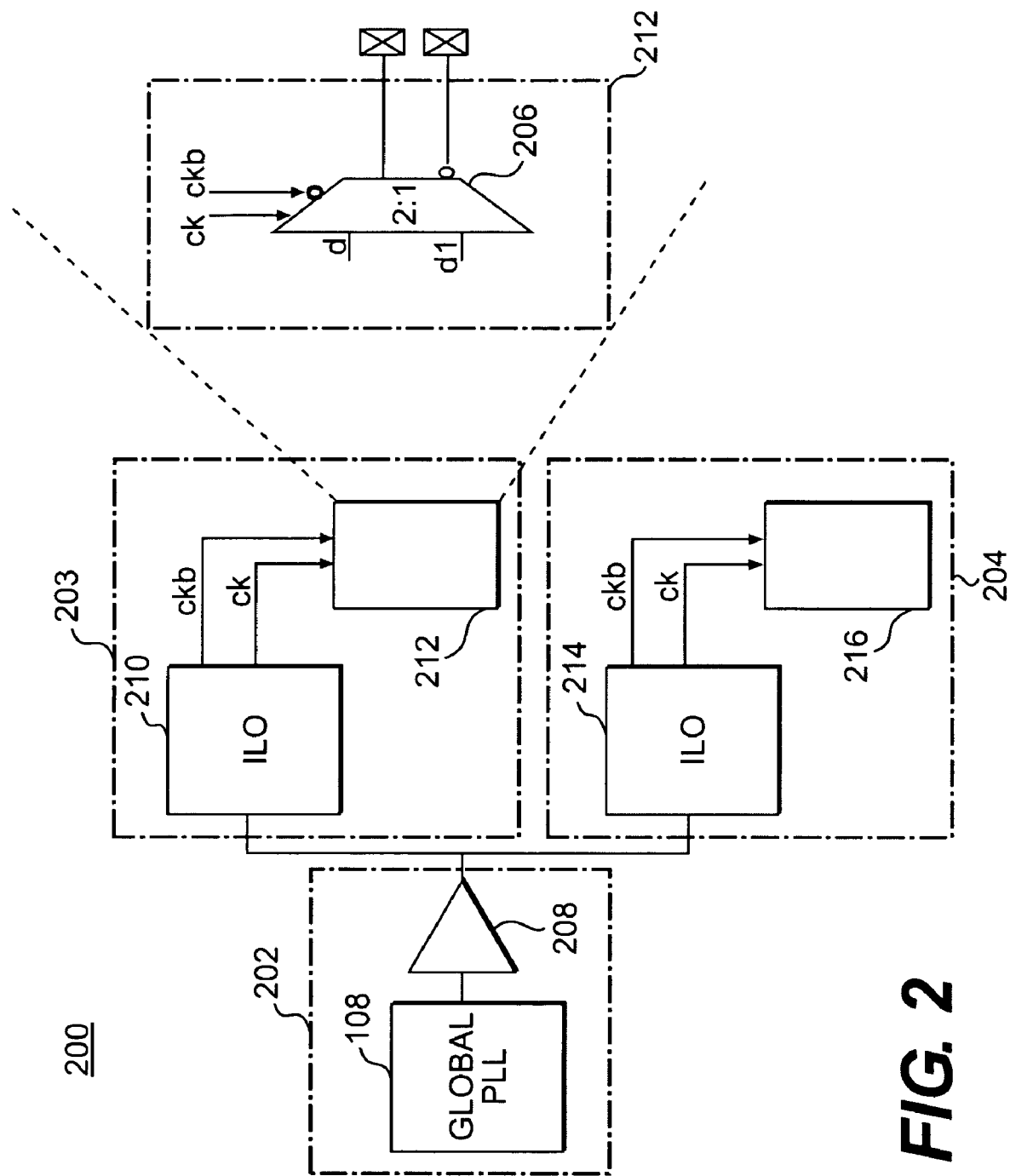
FIG. 2 is a block diagram of an architecture for clock distribution according to an example embodiment of the present invention.

FIG. 2 is a diagram of an architecture for clock distribution according to an example embodiment of the present invention. Other embodiments and configurations are also within the scope of the present invention. More specifically, FIG. 2 shows a clock distribution system 200 that includes a global clock generator 102 and a plurality of local circuits, such as a local circuit 203 and a local circuit 204. Other numbers of local circuits may also be provided. The global clock generator 202 may include a global PLL 108 and a buffer 208, for example. The clock signal generated by the global PLL 108 may be stored in the buffer 208. The buffer 208 may be coupled to the plurality of local circuits, such as the local circuit 203 and the local circuit 204. More specifically, the output of the buffer 208 may be coupled to an input of an ILO 210 in the local circuit 203. The output of the buffer 208 may be coupled to an input of an ILO 214 of the local circuit 204.

The ILO 210 and the ILO 214 may include circuitry to reduce a jitter in the clock signal, such as the clock signal supplied by the global PLL 108 through the buffer 208.

The ILO 210 may further include circuitry to reduce power consumption by reducing an effect of a load coupled to the ILO 210. The circuitry to reduce power consumption may nullify (or minimize) the effect of the load at a transmitting device (TX) 212 of the local circuit 204. The transmitting device 212 of the local circuit 204 may be a current mode logic (CML) transmitting device, for example. The transmitting device 212 may correspond to one of the transmitting devices 32, 34 and 36 in FIG. 1.

Output signals of the ILO 210 may be provided as clocking signals for the transmitting device 212. The output signals of the ILO 210 may include a clocking signal (shown as ck) and an inverted clocking signal (shown as ckb). The clock signal may synchronize the operation performed by the local circuit 203 with the plurality of local circuits, for example. The transmitting device 212 may include a 2:1 multiplexer 206 that receives inputs d and d1. The inputs d and d1 may be data signals or clock signals. A normal output and an inverted output of the 2:1 multiplexer 206 may be output based on the received inputs and the received clocking signals. Other types of multiplexers may also be used. The outputs of the local circuit 203 may be coupled to the plurality of local circuits and act as clocking signals to the plurality of local circuits.

The ILO 214 may further include circuitry to reduce power consumption by reducing an effect of a load coupled to the ILO 214. The circuitry to reduce power consumption may nullify (or minimize) the effect of the load at a transmitting device (TX) 216 of the local circuit 203. The transmitting device 216 of the local circuit 203 may be a current mode logic (CML) transmitting device, for example. The transmitting device 216 may correspond to one of the transmitting devices 32, 34 and 36 shown in FIG. 1.

Output signals of the ILO 214 may be fed as clocking signals for the transmitting device 216. The output signals of the ILO 214 may include a clocking signal (shown as ck) and an inverted clocking signal (shown as ckb). The clock signal may synchronize the operation performed by the local circuit 204 with the plurality of local circuits, for example. The transmitting device 216 may include a 2:1 multiplexer that receives inputs. The inputs may be data signals or clock signals. A normal output and an inverted output of the 2:1 multiplexer may be output based on the received inputs and the received clocking signals. The outputs of the local circuit 204 may be coupled to the plurality of local circuits and act as clocking signals to the plurality of local circuits.

Figure 3:
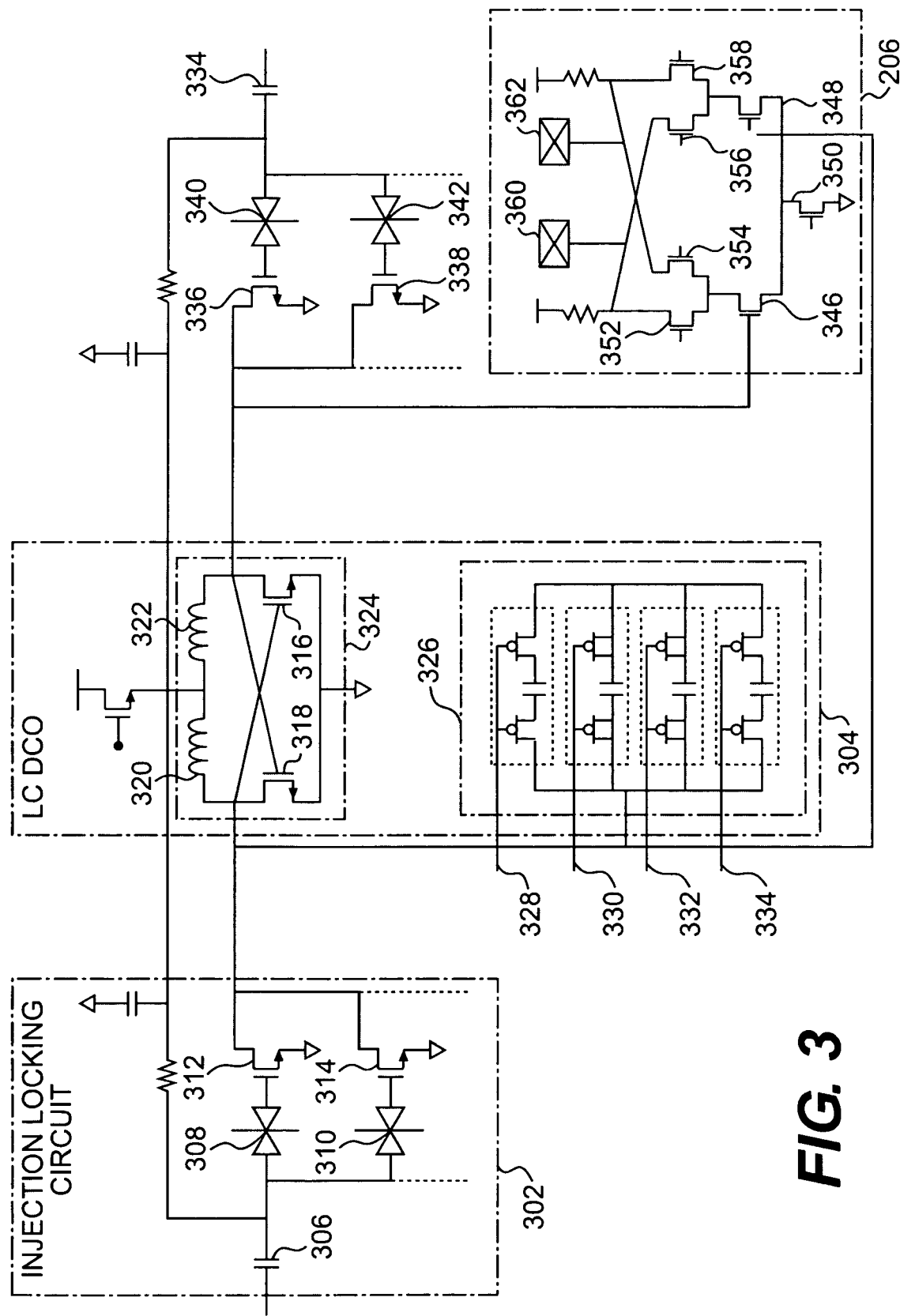
FIG. 3 is a diagram illustrating an architecture of an injection locked digitally controlled oscillator (ILDCO) according to an example embodiment of the present invention.

FIG. 3 is a diagram illustrating an architecture of an injection locked digitally controlled oscillator (ILDCO) according to an example embodiment of the present invention. Other embodiments and configurations are also within the scope of the present invention. More specifically, FIG. 3 shows features that may be provided in the ILOs 20, 54, 56 of FIG. 1, in the ILOs 210 or 214 of FIG. 2 or other ILOs.

The ILO may include an injection locking circuit 302 and an inductor-capacitor (LC) digitally controlled oscillator (DCO) 304. The LC DCO 304 may also be referred to as a tunable oscillator. The LC DCO 304 may include an LC tank circuit 324 and a variable capacitor circuit 326. The LC tank circuit 324 may also be referred to as an oscillator. The LC DCO 304 may be coupled to a multiplexer, such as the 2:1 multiplexer 206 shown in FIG. 2 or to another device.

The injection locking circuit 302 may be implemented as a voltage to current converter. For example, the clock signal (such as from the PLL circuit 10 or the global clock generator 202) may be received by the injection locking circuit 302. The output of a buffer (such as the buffer 208 of the global clock generator 202) may be applied to a capacitor 306. The capacitor 306 may be coupled to a transmission gate 308 (or passgate) and a transmission gate 310. The transmission gate 308 may be coupled to a gate of a field effect transistor (FET) 312 and the transmission gate 310 may be coupled to a gate of a FET 314. The transmission gates 308 and 310 may act as switched buffers to relay the clock signal to the FET 312 and the FET 314. Outputs of the transmission gates 308, 310 may be controlled using select signals. For example, the output of the transmission gate 308 may be controlled using select signals sel 0 and sel 0$^+$ (not shown). The output of the transmission gate 310 may be controlled using select signals sel 1 and sel 1$^+$ (not shown). The transmission gates 308, 310 may be used to control the strength (or gain) of the injection locking circuit 302. A source of each of the FET 312 and 314 may be coupled to the LC DCO 304. Other types of switches and/or gates may also be used.

The injection locking circuit 302 may reject jitter outside a lock range, thereby filtering the jitter outside the lock range from the received clock signal. The injection locking circuit 302 may lock the clock signal with a frequency lock range of the LC DCO 304. The LC DCO 304 may generate a signal with a frequency centered on a resonant frequency ($\omega_{osc}$) of the LC tank circuit 324 in the LC DCO 304. Further, the injection locking circuit 302 may have a low frequency sensitivity to supply noise induced jitter. The low frequency sensitivity to supply noise induced jitter may be because of the presence of only the LC DCO 304 in a path of the clock signal. A frequency sensitivity to supply noise jitter may be 100-200 MHz/V.

Further, as the jitter outside the lock range is filtered out, only the jitter in the lock range is to be filtered, and as a result a smaller $A_{inj}$, i.e., smaller swing on the clock signal in the injection locking circuit 302 is required. Therefore, a plurality of buffers may not be needed for distribution of the clock signal as in disadvantageous arrangements. Furthermore, a high resolution in a tuning range controlled by the variable capacitor circuit 326 of the LC DCO 304 may be implemented in order have a proper locking range. The variable capacitor circuit 326 may be used to produce a variable phase shift (or skew) between the input versus output clock of the ILO.

A formula for calculating the lock range will now be described with reference to Equations (1), (2) and (3).

$$K = (A_{inj})/(A_{osc}) \qquad \text{Equation (1)}$$

$$\pm \omega_L = \omega_{inj} - \omega_{osc} \qquad \text{Equation (2)}$$

$$(\omega_{inj} - \omega_{osc}) = \frac{\omega_{osc}}{2Q} \cdot \sqrt{\frac{K}{1-K^2}}, \qquad \text{Equation (3)}$$

where K is a ratio of $A_{inj}$ of the injection locking circuit 302 and $A_{osc}$ of the LC DCO 304. $A_{inj}$ is a gain parameter of the injection locking circuit 302 and the $A_{osc}$ is a gain parameter of the LC DCO 304. Additionally, $\omega_L$ is an upper bound frequency of the lock range, $-\omega_L$ is a lower bound frequency of the lock range and $\omega_{osc}$ is the resonant frequency of the tank circuit 324.

An inverted clock signal (such as from the PLL circuit 10 or the global clock generator 202) may be supplied to a capacitor 344. The capacitor 344 may also be coupled to a transmission gate 340 and a transmission gate 342. The transmission gate 340 may be coupled to a gate of a FET 336 and the transmission gate 342 may be coupled to a gate terminal of a FET 338. A source terminal of each of the FET 336 and the FET 338 may be coupled to the LC DCO circuit 304.

The sources of the FETs 312 and 314 may be coupled to a gate terminal of a FET 316 in the LC DCO 304. The sources of the FETs 336 and 338 may be coupled to a gate of a FET 318 in the LC DCO circuit 304. The LC tank circuit 324 may include the FET 318, the FET 316, an inductor 320 and an inductor 322. The LC tank circuit 324 may reduce power consumption by reducing an effect of a load at a transmitting device, such as the transmitting devices 34, 36 or the transmitting devices 212, 216. The load at the respective transmitting device may be a capacitive load and the LC tank circuit 324 may nullify the effect of the capacitive load. Further, the inductor 322 may have a low value for a given operating frequency to trade off with more tunable capacitors, thereby increasing a tuning range of the LC DCO 304, which otherwise would be limited due to a constant load capacitor.

The variable capacitor circuit 326 may provide the clock signal to the 2:1 multiplexer 206 according to a state of terminals 328, 330, 332 and 334. A first input to the variable capacitor circuit 326 may be coupled to the source of the FET 312 and the source of the FET 314. A second input to the variable capacitor circuit 326 may be coupled to the source of the FET 336 and the source of the FET 338. An output of the variable capacitor circuit 326 may be determined based on the state of the terminals 328, 330, 332 and 334.

An output of the variable capacitor circuit 326 may be provided to the 2:1 multiplexer 206. The 2:1 multiplexer 206 may include a plurality of FETs 346, 348, 350, 352, 354, 356 and 358 as shown in FIG. 3. The output 360 of the 2:1 multiplexer 206 may be in a high state when the clock signal is in a high state and the output 362 of the 2:1 multiplexer 206 may be in a high state when the inverted clock signal is in a high state. The outputs 360 and 362 of the 2:1 multiplexer 206 may be used as clocking signals as discussed above.

Since the LC DCO 304 nullifies the effect of the capacitive load at the transmitting device, the 2:1 multiplexer 206 may be designed large enough to drive the outputs of the transmitting device. Thus, there may be no need for a pre-driver and/or final-driver.

Embodiments of the present invention may provide an apparatus that includes an injection locked oscillator to receive a first clock signal and to provide a second clock signal by skewing and/or multiplying the first clock signal, and a transmitting device to receive an input signal and to receive the second clock signal as a clocking signal, the transmitting device to transmit an output signal based on the received clocking signal.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An apparatus comprising:
an injection locked oscillator to receive a first clock signal and to provide a second clock signal by skewing the first clock signal, the injection locked oscillator to include an injection locking circuit and an oscillation circuit that has an inductor-capacitor (LC) tank circuit and a variable capacitor circuit, the variable capacitor circuit to provide a variable skew between the first clock signal and the second clock signal;
a transmitting device to receive an input signal and to receive the second clock signal as a clocking signal, the transmitting device to transmit an output signal based on the received clocking signal, the transmitting device including:
a first transmitting device to receive a data signal as the input signal and to transmit the output signal along a transmission line based on the received second clock signal, and
a second transmitting device to receive the first clock signal as a clocking signal and to transmit an output signal along a transmission line based on the received clocking signal;
a receiving injection locked oscillator to receive the output signal from the second transmitting device, to skew the received output signal, and to provide a skewed clocking signal; and
a receiving device to receive the skewed clocking signal from the receiving injection locked oscillator, to receive the output signal from the first transmitting device and to provide an output based on the received clocking signal and the received signal from the first transmitting device.

2. The apparatus of claim 1, wherein the injection locking circuit includes a voltage to current converter.

3. The apparatus of claim 1, wherein the injection locking circuit to reduce jitter in the second clock signal.

4. The apparatus of claim 1, wherein the oscillation circuit to reduce power consumption.

5. The apparatus of claim 1, wherein the injection locked oscillator to skew the first clock signal for time margining testing of the first clock signal relative to a data signal.

6. The apparatus of claim 1, further comprising a receiver to receive the output signal transmitted by the transmitting device and to provide a further output signal by deskewing the output signal.

7. The apparatus of claim 1, wherein the variable capacitor circuit to provide the second clock signal to a multiplexer of the transmitting device.

8. The apparatus of claim 7, wherein the injection locked circuit includes a plurality of transistors, and the variable capacitor circuit includes a plurality of terminals each coupled to a separate one of the transistors of the injection locked circuit.

* * * * *